United States Patent
Yuan et al.

(10) Patent No.: US 12,094,987 B2
(45) Date of Patent: Sep. 17, 2024

(54) INTEGRATED OPTICAL FILTER AND PHOTODETECTOR AND METHODS OF FABRICATING THE SAME

(71) Applicant: Hewlett Packard Enterprise Development LP, Houston, TX (US)

(72) Inventors: Yuan Yuan, Milpitas, CA (US); Zhihong Huang, Milpitas, CA (US); Di Liang, Santa Barbara, CA (US); Xiaoge Zeng, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 810 days.

(21) Appl. No.: 17/073,152

(22) Filed: Oct. 16, 2020

(65) Prior Publication Data

US 2022/0123159 A1   Apr. 21, 2022

(51) Int. Cl.
*H01L 31/0232* (2014.01)
*G02B 6/293* (2006.01)
(Continued)

(52) U.S. Cl.
CPC .... *H01L 31/02327* (2013.01); *G02B 6/29338* (2013.01); *G02B 6/4215* (2013.01); *H01L 27/1446* (2013.01); *H01L 31/1085* (2013.01); *H01L 31/1804* (2013.01); *H04B 10/25* (2013.01); *H04B 10/516* (2013.01); *H04B 10/5051* (2013.01); *H04B 10/506* (2013.01); *H04B 10/67* (2013.01)

(58) Field of Classification Search
None
See application file for complete search history.

(56) References Cited

U.S. PATENT DOCUMENTS

2005/0110108 A1   5/2005   Patel et al.
2009/0134486 A1   5/2009   Fujikata et al.
(Continued)

FOREIGN PATENT DOCUMENTS

CN   104157721 A   11/2014
JP   2019016720 A * 1/2019

OTHER PUBLICATIONS

Goykhman et al., Optics Express, vol. 20, No. 27, Waveguide Basedcompact Silicon Schottky Photodetector With Enhanced Responsisvity in the Teleco Spectral Band, Nov. 28, 2012 (Year: 2012).*

(Continued)

*Primary Examiner* — Leslie C Pascal
(74) *Attorney, Agent, or Firm* — Hewlett Packard Enterprise Patent Department

(57) ABSTRACT

Integrated optical filter and photodetectors and methods of fabrication thereof are described herein according to the present disclosure. An example of an integrated optical filter and photodetector described herein includes a substrate, an insulator layer on the substrate, and a semiconductor layer on the insulator layer. An optical filter having a resonant cavity is formed in or on the semiconductor layer. The integrated optical filter and photodetector further includes two first metal fingers and a second metal finger interdigitated between the two first metal fingers on the semiconductor layer forming Schottky barriers. The first metal fingers are constructed from a different metal relative to the second metal finger.

18 Claims, 5 Drawing Sheets

(51) Int. Cl.
| | |
|---|---|
| G02B 6/42 | (2006.01) |
| H01L 27/144 | (2006.01) |
| H01L 31/108 | (2006.01) |
| H01L 31/18 | (2006.01) |
| H04B 10/25 | (2013.01) |
| H04B 10/50 | (2013.01) |
| H04B 10/516 | (2013.01) |
| H04B 10/67 | (2013.01) |

(56) References Cited

U.S. PATENT DOCUMENTS

2015/0263190 A1* 9/2015 Knights ............... G02F 1/0123
250/201.1
2019/0348564 A1 11/2019 Lin et al.

OTHER PUBLICATIONS

Li et al., IEEE Photonics Technology Letters, vol. 27, No. 7, pp. 729-732, 40 GB/s All silicon Photodetector Based on Microring Resonators (Year: 2015).*
Shuler et al., Cornell University Library, Jul. 6, 2020, High-Responsivity graphene photodetectors integrated on silicon microring resonators (Year: 2020).*
Hosseinifar et al., IEEE Photonics Technology Letters, vol. 28, No. 12, pp. 1363-1366 (Year: 2016).*
Atabaki et al., "High-speed polysilicon CMOS photodetector for telecom and datacom," Applied Physics Letters, vol. 109, No. 11, 111106, 2016, 7 pages.
Casalino et al., "Asymmetric MSM sub-bandgap all-silicon photodetector with low dark current," Optical Society of America, vol. 21, No. 23, pp. 28072-28082.
Chatterjee et al., "Compact Cavity Enhanced Si MSM Photodetector in SiN-on-SOI", European Conference on Integrated Optics (ECIO), 2019, 3 pages.
Chen et al., "Two-photon absorption photocurrent in pin diode embedded silicon microdisk resonators," Applied Physics Letters vol. 96, No. 19, 191106, 2010, pp. 1-3.
Feng et al., "All-Si Photodetectors with a Resonant Cavity for Near-Infrared Polarimetric Detection", Nanoscale Research Letters, Jan. 30, 2019, pp. 1-9.
Goykhman et al., "On-Chip Integrated, Silicon-Graphene Plasmonic Schottky Photodetector with High Responsivity and Avalanche Photogain", American Chemical Society, Apr. 7, 2016, pp. 3005-3013.
Hosseinifar et al., "Si-Schottky photodetector based on metal stripe in slot-waveguide microring resonator." IEEE Photonics Technology Letters, vol. 28, No. 12, 2016, pp. 1363-1366.
Kwon et al., "Ultra-Compact Silicon Waveguide-Integrated Schottky photodetectors Using Perfect Absorption from Tapered Metal Nanobrick Arrays", Optics Express, vol. 27, No. 12, Jun. 10, 2019, pp. 16413-16424.
Li et al., "40 GB/s All-silicon Photodetector Based on Microring Resonators," IEEE Photonics Technology Letters, vol. 27 no. 7, Apr. 1, 2015, pp. 729-732.
Liang et al., "Integrated Green DWDM Photonics for Next-Gen High-Performance Computing," Optical Fiber Communications Conference and Exhibition (OFC), Mar. 8-12, 2020.
Pierre Berini, "Plasmon-polariton waves guided by thin lossy metal films of finite width: Bound modes of asymmetric structures," The American Physical Society, Physical Review B, vol. 63, No. 12, Apr. 15, 2000, p. 10 484-10 503.
Sakib et al., "A 112 GB/s all-silicon micro-ring photodetector for datacom applications," Optical Fiber Communication Conference, Jan. 2020, 3 pages.

* cited by examiner

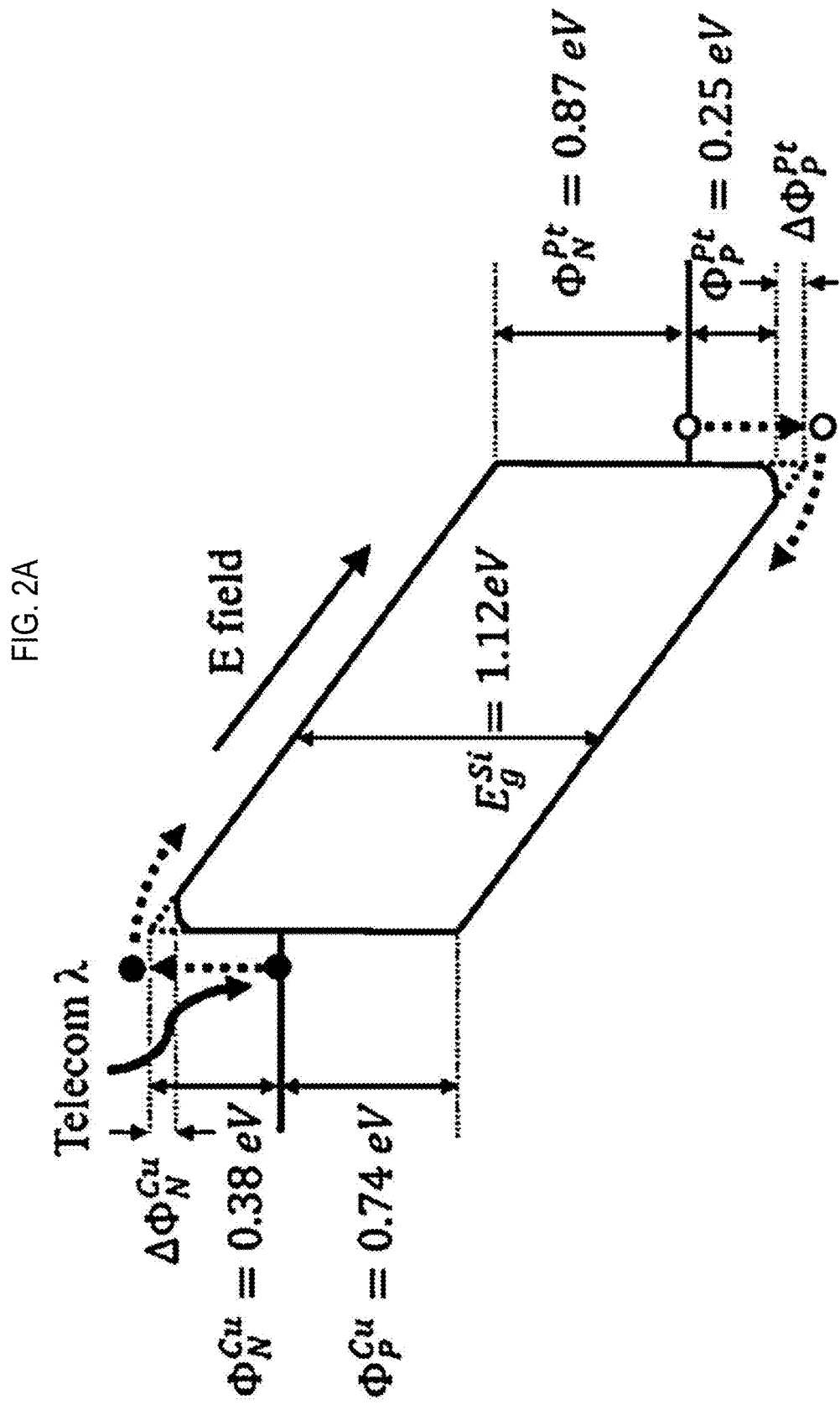

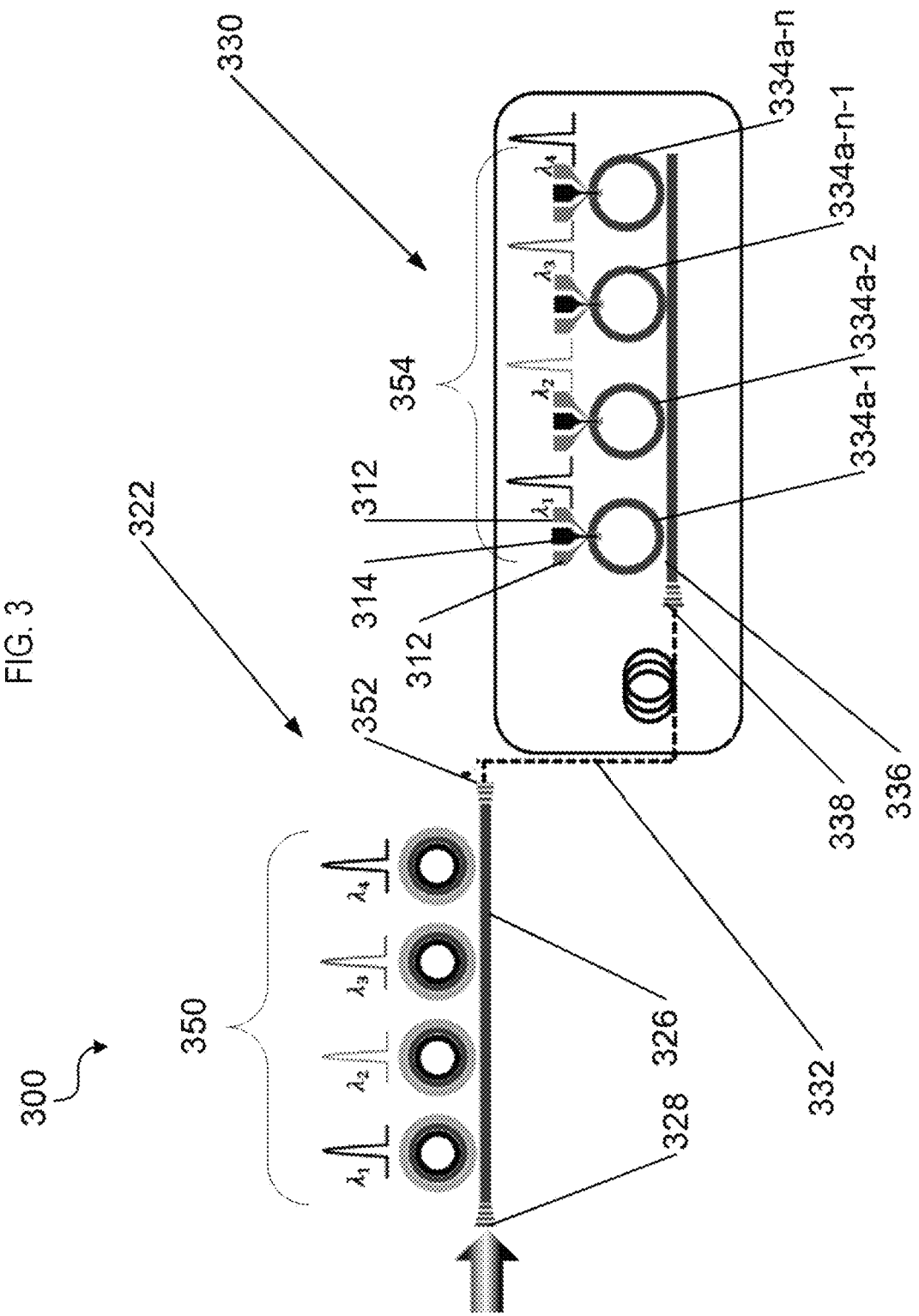

INTEGRATED OPTICAL FILTER AND PHOTODETECTOR AND METHODS OF FABRICATING THE SAME

STATEMENT OF GOVERNMENT RIGHTS

This invention was made with Government support under Agreement Number H98230-19-3-0002. The Government has certain rights in the invention.

BACKGROUND

Optoelectronic communication (e.g., using optical signals to transmit electronic data) is becoming more prevalent as a potential solution, at least in part, to the ever increasing demand for high bandwidth, high quality, and low power consumption data transfer in applications such as high performance computing systems, large capacity data storage servers, and network devices. Optoelectronic systems or devices such as photonic integrated circuits (PICs) have a plurality of electronic, optical, and optoelectronic components that can be used to convert, transmit, or process the optical signals or electronic data. For example, optical filters can be used to separate or filter (e.g., demultiplex) individual wavelengths of a composite or multi-wavelength optical signal. Photodetectors can then be used to detect and convert the optical signals on each individual wavelength into electrical signals. Improved integrated optical filter and photodetectors that can filter, detect, and convert optical signals and methods of fabricating the same are described herein.

BRIEF DESCRIPTION OF THE DRAWINGS

Certain examples are described in the following detailed description and in reference to the drawings, in which:

FIG. 2A illustrates a band structure diagram of an Si-based Schottky photodetector with a reverse bias as described herein according to an implementation of the present disclosure;

FIG. 3 schematically illustrates an optical system having an optical receiver including an array of integrated optical filters and photodetectors as described herein according to an implementation of the present disclosure.

DETAILED DESCRIPTION OF SPECIFIC EXAMPLES

Figure 1A:
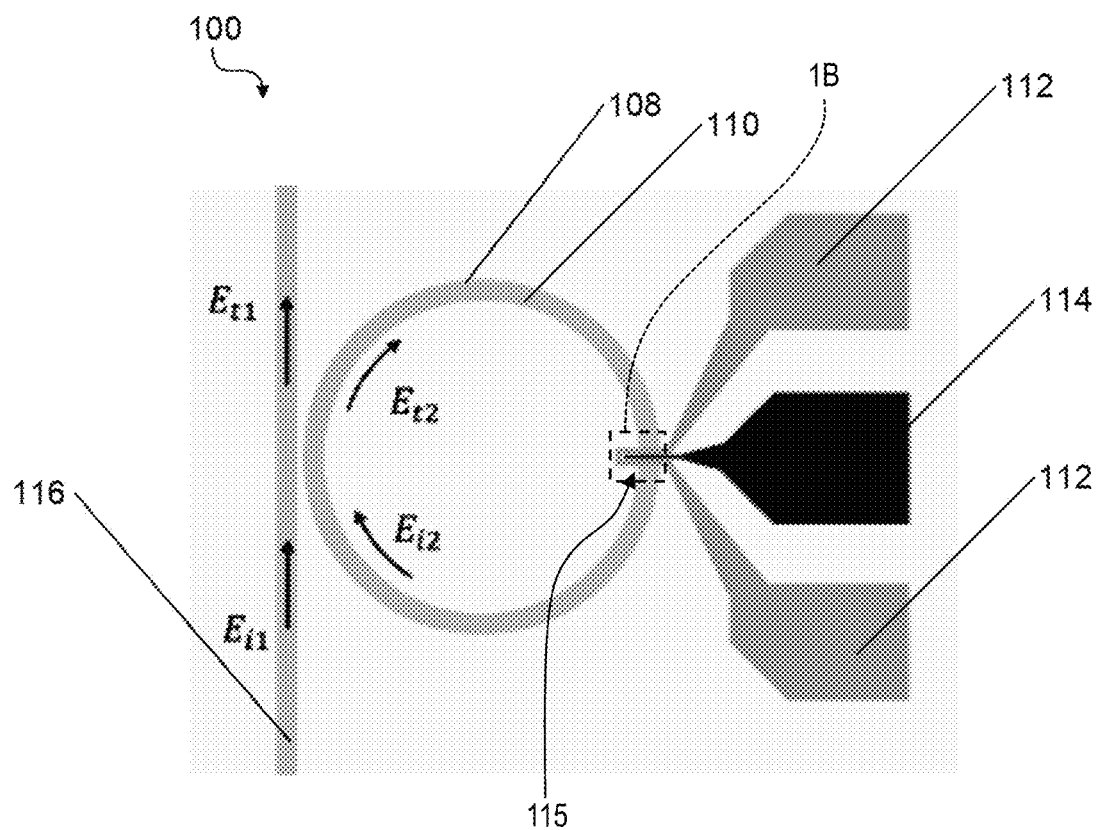
FIG. 1A illustrates a top view of an example of an integrated optical filter and photodetector according to an implementation of the present disclosure.

Photonics integrated circuits (PICs), and in particular, silicon (Si) photonics technology has drawn increased interest as a platform for low-cost, high-speed optical interconnects and data transport due to its ability to overcome data density limitations of conventional electronic systems. An important application of Si photonics is in the context of a high-speed, low-energy wavelength division multiplexing (WDM) or Dense Wavelength Division Multiplexing (DWDM) optical link which can be used in data centers and high-performance computers (HPCs).

WDM or DWDM optical links or systems include an optical receiver. Typically, the optical receiver generally includes multiple optical filters and separate respective photodetectors depending on a desired number of optical channels (e.g., a four-channel optical link includes four optical filters in order to select or filter four specific wavelengths to be passed to four respective photodetectors). Each of the optical filters is coupled to an input waveguide of the receiver to filter a respective wavelength of light from a multi-wavelength optical signal propagating through the input waveguide. Each of the optical filters then provides the respective filtered wavelength of light to a respective photodetector to be converted into an electrical signal (e.g., for further processing) via a separate respective waveguide from the input waveguide. Consequently, this leads to an increased number of components which necessitates increased space as well as the complexity of such optical links.

Additionally because of the wide bandgap of Si (e.g., ~1.12 eV) in Si photonic platforms, a heterogeneous integration of germanium (Ge) may be required for telecommunication wavelength photodetection (e.g., 1310 nm or 1550 nm) on certain Si photonic platforms, thereby increasing the process time and complexity as well as the costs of fabrication. For example, some conventional photodetectors on Si photonic platforms are based on a Si—Ge heterojunction (e.g., a Ge absorption layer that can require a selective epitaxy on the Si on insulator (SOI) wafer of such platforms). This Ge epitaxy can take several extra steps that adds process complexity, time, and cost.

Therefore, some all-Si photodetectors and methods have been proposed, such as using a two-photon absorption mechanism, inserting mid-bandgap defects states into a Si lattice, or depositing a polysilicon active layer. Such devices and methods either exhibit very poor responsivity (e.g., ~tens mA/W) or introduce other complex fabrication or processing steps. Further, many existing photodetectors cannot achieve the requisite high bandwidth and good responsivity simultaneously (e.g., for telecommunication wavelength photodetection).

Various embodiments described herein are directed to an improved integrated optical filter and photodetector. The disclosed integrated optical filter and photodetectors are uniquely configured to provide both filtering and photodetecting capabilities and able to achieve the requisite high bandwidth and good responsivity simultaneously for telecommunication wavelength photodetection (e.g., 1310 nm or 1550 nm). For example, the integrated optical filter and photodetector can operate as a filter and photodetector in an optical receiver used in optical communication technologies, such as WDM and DWDM. Because of the integration of optical filtering and photodetection functionality within a single component or device, its implementation in optical receivers can provide advantages over many other conventional receiver designs.

Additionally, in accordance with particular implementations of the present disclosure, the improved integrated optical filter and photodetector and methods of fabricating the same, as described herein, can include an optical filter with a resonant cavity. For example, an optical resonator having a microring or ring resonator structure (e.g., a Si ring resonator) that can be configured to be directly used as an optical wavelength filter (e.g., in order to simplify the optical link accordingly). The resonant cavity of the optical filter can enhance responsivity for photodetection as described in more detail below, as well as being capable of acting as an optical wavelength filter resulting in a low-cost, high-speed, and good responsivity integrated optical filter and photodetector.

In some implementations, the integrated optical filter and photodetector includes a Schottky photodetector on a resonant cavity of a ring resonator which is operable for telecommunication wavelengths. As described in further detail below, instead of heterogeneous integration of Ge, in some implementations, metal fingers are grown or deposited directly on top of a Si ring resonator (or other enhancement cavity resonator) to form a Si ring resonator-based Schottky photodetector. Further, by adjusting one or more dimensions of the metal fingers (e.g., a width, thickness, or length), a surface plasmon polaritons (SPP) effect can be achieved for further enhancement of light-matter interaction in addition to the enhanced responsivity from the ring resonator cavity. As such, the integrated optical filter and photodetector as described herein can include a metal-semiconductor-metal (MSM) photodetector structure with thin metal fingers grown or otherwise formed directly on a Si ring resonator. Due to the absorption enhancement from a resonant cavity of the ring resonator and the SPP effect, the integrated optical filter and photodetector can provide a solution that meets the requisite speed and responsivity (e.g., high bandwidth and good responsivity) for telecommunication wavelength photodetection requirements.

An "optical fiber" as described herein can refer to a single optical fiber (e.g., including a core and a cladding) to provide unidirectional or bidirectional optical communication, can refer to a bidirectional pair of optical fibers (e.g., each including a core and a cladding) to provide both transmit and receive communications in an optical network, or can refer to a multi-core fiber, such that a single cladding could encapsulate a plurality of single-mode cores. As used herein, when a first material or layer is disposed "over" a second material or layer, then the first material or layer may be directly contacting the second material or layer or there may be one or more intervening materials or layers between the first and second materials or layers. If a first material or layer is "on" a second material or layer, then the first material or layer is directly contacting the second material or layer or there is a bonding material or layer between the first and second materials or layers.

Figure 1B:
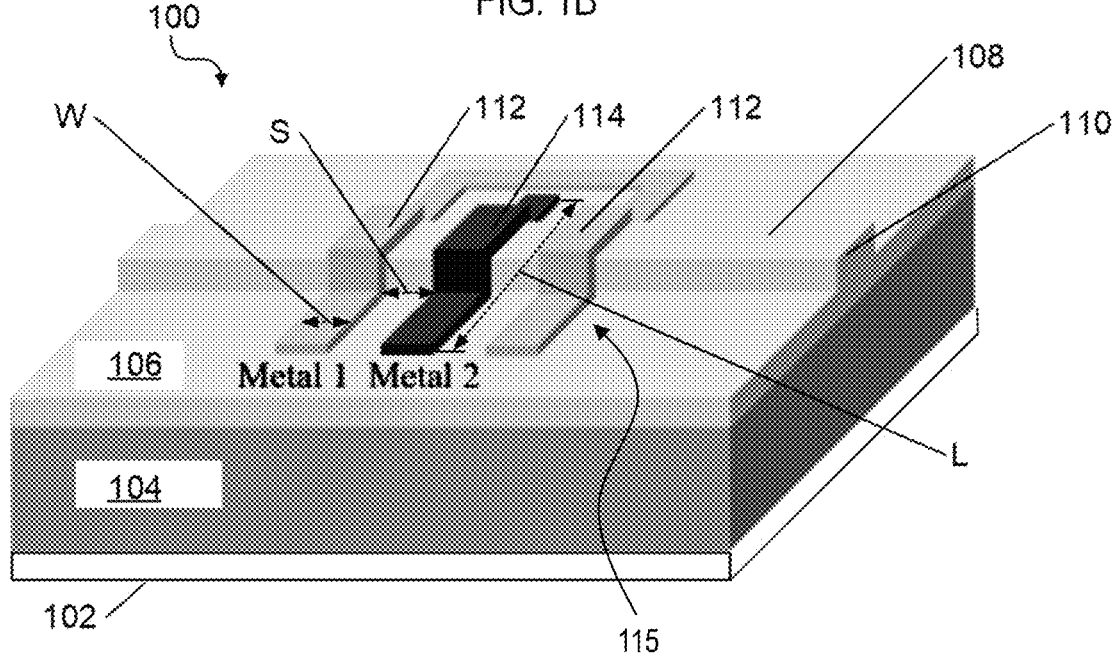
FIG. 1B illustrates a section view of a portion 1B of the integrated optical filter and photodetector of FIG. 1A.

FIGS. 1A-1B illustrate an example of an integrated optical filter and photodetector 100 according to the present disclosure. The integrated optical filter and photodetector 100 is a semiconductor-based device and includes a substrate 102 (e.g., an organic substrate layer), an insulator layer 104 on the substrate 102, and a semiconductor layer 106 on the insulator layer 104. The integrated optical filter and photodetector 100 comprises an optical filter 108 and a photodetector 115 integrated together. As shown in FIG. 1A, the optical filter 108 having a resonant cavity 110 (e.g., a ring resonator) is formed in or on the semiconductor layer 106 as described in more detail below. Additionally, as shown in FIG. 1B and as described in more detail below, the photodetector 115 of the integrated optical filter and photodetector 100 includes a portion of the resonant cavity 110 and at least two metal fingers (e.g., a first metal finger 112 and a second metal finger 114) formed on the semiconductor layer 106 extending across the portion of the resonant cavity 110. For example, in the illustrated example, the integrated optical filter and photodetector 100 includes two first metal fingers 112 and a second metal finger 114 interdigitated between the two first metal fingers 112 deposited or otherwise formed on the semiconductor layer 106 forming Schottky barriers (e.g., at respective junctions or interfaces of the metal fingers and the semiconductor layer).

In other examples, only one first metal finger 112 and one second metal finger 114 are included. In other examples, the integrated optical filter and photodetector 100 includes more than three metal fingers (e.g., four, five, six, seven, eight, nine). A same number of first and second metal fingers or a different number of first and second metal fingers can be included. Moreover, by changing a number of metal fingers, a loss of the ring resonator (as described in more detail below) can be tuned. The first metal finger or fingers 112 are constructed from a different metal relative to the second metal finger or fingers 114 (e.g., to provide suitable electron and hole barrier heights as described in more detail below). Further, the first and second metal fingers 112 and 114 can be coupled to ground and signal pads as described in more detail below.

The substrate 102 can be made of one or more semiconductor materials including, but not limited to, Silicon (Si), Indium phosphide (InP), Germanium (Ge), Gallium Arsenide (GaAs), Silicon Carbide (SiC), or combinations thereof. In particular implementations as described herein, the substrate 102 is a Si substrate. For example, the optical filter and photodetector 100 is a silicon-on-insulator (SOI) having the insulating layer 104 sandwiched between a Si substrate and a Si semiconductor layer (e.g., the substrate 102 and semiconductor layer 106). In other implementations, the optical filter and photodetector 100 has a silicon-on-glass structure.

In some implementations, the insulating layer 104 is a buried oxide (BOX) layer composed of silicon dioxide or other insulating oxide material. In certain implementations, the insulating layer 104 can be formed by oxidizing the substrate 102. For example, when the substrate 102 is made of Si, the insulating layer 104 can be silicon dioxide ($SiO_2$) that can be formed in the presence of oxygen at a temperature in the range 900° C. to 1300° C. In other implementations, the insulating layer 104 can be a buried oxide layer, such that the silicon-dioxide is buried in the substrate 102. In some examples, a layer of the silicon-dioxide acting as the insulating layer 104 can be buried in the substrate 102 at a depth ranging from less than 100 nm to several micrometers from the substrate or wafer surface depending on application. In yet other implementations, the insulating layer 104 is composed of another insulating material such as sapphire, diamond, or glass.

As illustrated in the implementation of FIGS. 1A-1B, the optical filter 108 of the integrated optical filter and photodetector 100 can be a ring resonator (e.g., Si ring resonator) having a resonant cavity 110. The ring resonator (e.g., closed-loop waveguide) filters or couples a resonant wavelength of light from a bus waveguide or other suitable output waveguide 116. The light resonance in the resonant cavity 110 can greatly improve the length of light-matter interaction and can therefore lessen the amount or level of light absorption necessary at the interface or junction between the metal fingers 112 and 114 (e.g., directly on the ring resonator as described in more detail below) and the semiconductor layer 106. Additionally, a quality (Q) factor of the ring resonator is highly dependent on a loss coefficient of the ring resonator. As such, even though absorption per circle (e.g., cycle) can be relatively low, the Q factor of the ring resonator can enable a higher optical intensity in the ring resonator (e.g., which can further compensate for total absorption value), thereby enhancing responsivity. For example, the responsivity can be enhanced to a value from about 0.1 to 0.3 A/W.

As discussed above, the first and second metal fingers 112 and 114 are deposited or otherwise formed directly on the semiconductor layer 106 (e.g., the ring resonator formed in or on the semiconductor layer 106). The semiconductor layer 106 or ring resonator formed in or on the semiconductor layer 106 can be formed from an undoped or intrinsic semiconductor material (e.g., Si) because the metal fingers 112 and 114 are directly on the ring resonator or semiconductor layer 106 forming Schottky barriers (e.g., to form a Schottky photodetector) without any intervening doped layers in contrast with a PIN photodiode (e.g., to deposit Ge thereon). In other words, the integrated optical filter and photodetector 100 with Schottky barriers can absorb light of telecommunication wavelengths (e.g., with Si as the semiconductor layer 106) without additional doping process or Ge epitaxy steps. Additionally, the undoped semiconductor or Si layer is good for carrier transit. A low bias voltage will deplete the undoped region between the metal fingers, and thus the electric field can make the carriers draft through the depletion region which can result in higher bandwidth. Further, the undoped semiconductor layer can avoid free carrier absorption to reduce optical loss in the ring resonator. Finally, undoped Si or other semiconductor material can simplify process complexity as discussed herein (e.g., no additional doping processes are required and issues with doping diffusion caused by process heat).

Figure 1C:
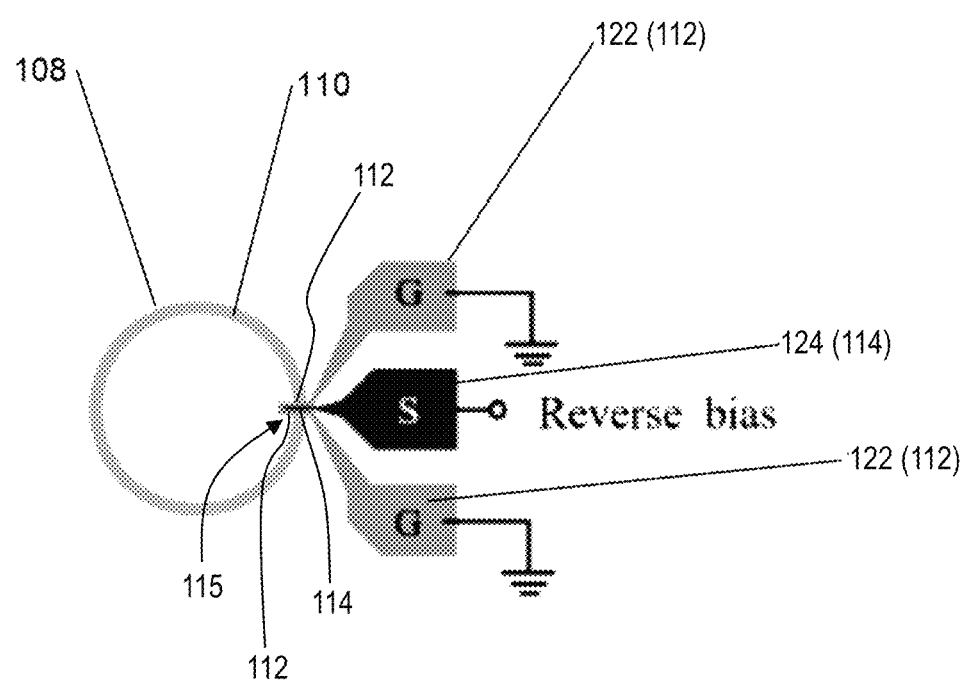
FIG. 1C illustrates a schematic of the integrated optical filter and photodetector of FIG. 1A coupled to ground-signal-ground (GSG) pads according to an implementation of the present disclosure.

The first and second metal fingers 112 and 114 are disposed on the ring resonator or semiconductor layer 106 such that the photodetector 115 has a metal-semiconductor-metal (MSM) structure. The first and second metal fingers 112 and 114 can be coupled with ground-signal-ground (GSG) pads as illustrated in FIG. 1C. In some implementations, as illustrated, the first metal fingers 112 are coupled to ground pads 122 and the second metal finger 114 is coupled to a signal pad 124 and configured to be reverse biased to achieve a GSG configuration.

Metals with appropriate work functions (e.g., $\varphi_M$) for the first and second metal fingers 112 and 114 are selected in order to realize an effective barrier emission probability. Generally, quantum efficiency of a Schottky photodetector (e.g., the integrated optical filter and photodetector 100) increases with lower barrier height. However, typically, a dark current will also increase with lower barrier height. Therefore, a suitable Schottky barrier height is required to maximize a sensitivity of the integrated optical filter and photodetector 100 (e.g., the MSM photodetector). Several metal combinations (e.g., Cu/Al, Cu/Pt, Cu/Pd, Cu/Au or other suitable metal material combinations) for the first and second metal fingers 112 and 114 can be selected to form Schottky barriers (e.g., on an Si-based semiconductor layer 106 or ring resonator) with suitable barrier heights (e.g., about 0.2 eV to 0.4 eV).

As an example, a band structure diagram of a Si-based Schottky photodetector (e.g., the integrated optical filter and photodetector 100 of FIG. 1C) with a reverse bias is illustrated in FIG. 2A. As illustrated, an image force effect can be seen or exhibited at the corners which can further improve an internal photoemission effect (IPE) or AO of the respective Schottky barriers (e.g., Cu and Pt metal fingers) and reduce effective barrier heights, where $\varphi_N$ and $\varphi_P$ represent the electron and hole barrier heights of the respective metal fingers (e.g., having suitable barrier heights of about 0.38 eV and 0.25 eV, respectively) and Eg is the energy gap of the semiconductor layer 106. IPE increases with bias voltage. Therefore, as voltage is applied to the metal fingers, the image force effect leads to increased IPE and reduced effective barrier heights.

Referring further to the example of FIG. 2A, the Si-based semiconductor layer 106 or ring resonator has an energy gap or bandgap of about 1.12 eV. The metal fingers 112 and 114 are constructed of different metals (e.g., Pt and Cu) as described above and coupled to ground pads and a signal pad, respectively. As illustrated, by selecting appropriate different metals for the metal fingers, both suitable hole and electron barrier heights (e.g., 0.25 eV and 0.38 eV) and responsivity (e.g., for telecom wavelengths) for the integrated optical filter and photodetectors as described herein can be achieved.

Additionally, by configuring the metal fingers 112 and 114 of the MSM photodetector with appropriate dimensions (e.g., thickness T, width W, and length L) as well as spacing S (e.g., edge to edge) between the metal fingers, a surface plasmon polaritons (SPP) effect can be realized in order to further confine the optical mode at the interface or junction of the metal fingers 112 and 114 and the semiconductor layer 106 (e.g., Si ring resonator). Such improved optical confinement allows a reasonable loss coefficient (e.g., of the ring resonator) to achieve a high photon lifetime-limited bandwidth for the integrated optical filter and photodetector 100. Additionally, because of the MSM structure of the integrated optical filter and photodetector 100, it has the ability to achieve a very high bandwidth (up to ~THz) because of the small gaps or spaces between the metal fingers and widths W and the very small RC time constant (e.g., by adjusting metal finger widths and spacing). In some examples as described herein, W can range from about 300 nm to 500 nm, T can range from about 10 to 70 nm, S can range from about 100 nm to 1000 nm, and L can range from about ~100 s of nm to several μm.

Figure 2B:
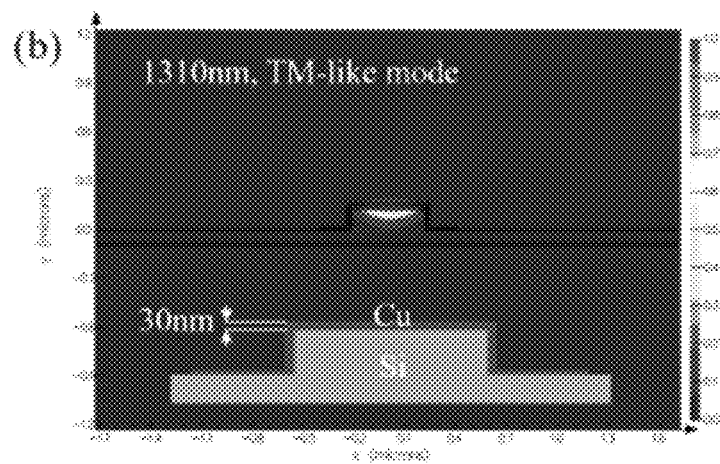
FIG. 2B and FIG. 2C illustrate confined optical modes within a closed-loop silicon waveguide of the integrated optical filter and photodetector of FIGS. 1A and 2A surrounded by a copper metal finger and a platinum metal finger on a semiconductor layer, respectively, according to an implementation of the present disclosure.
Figure 2C:
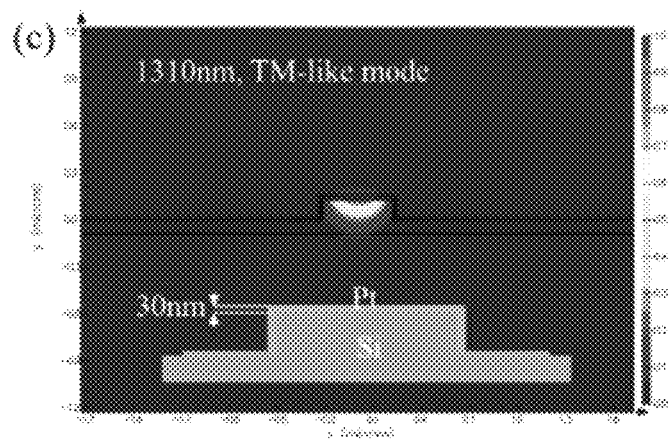

Further, configuring the metal fingers with a thickness T sufficiently below a carrier mean free path can also improve the internal quantum efficiency. FIGS. 2B-2C illustrate the confined optical mode in the closed-loop waveguide of a ring resonator of the integrated optical filter and photodetector 100 with Cu and Pt metal fingers (T=30 nm, W=450 nm, L=500 nm, S=500 nm on a Si ring resonator, respectively, and a 1310 nm wavelength optical signal. With reference back to FIG. 2A, the Cu fingers have relatively low barrier height for electrons and the Pt finger has a relatively low barrier height for holes such that the integrated optical filter and photodetector 100 has suitable barrier heights as described herein for both electrons and holes.

With asymmetric cladding layers (e.g., different dielectrics above and below the metal fingers), a bond TM-like mode (e.g., a quasi TM-mode) can be observed due to the SPP effect discussed above. While the metal fingers illustrated are sandwiched between Si and air, in other examples, the metal fingers can be sandwiched between other materials such as Si and $SiO_2$). The SPP effect is a coupled excitation involving electron oscillation in the metal (e.g., the metal fingers 112 and 114) and an electromagnetic wave. This TM-like surface mode due to the SPP effect enables an increased confinement (e.g., of light mode around the interface between the metal and Si) and a higher loss coefficient so light has a higher probability to be absorbed by the integrated optical filter and photodetector 100 resulting in better optical absorption per circle.

With reference to FIG. 3, an optical system 300 includes an optical transmitter 322 coupled to an optical receiver 330 via an optical fiber 332 (e.g., forming a WDM or DWDM optical link). The optical transmitter 322 includes a multi-wavelength optical source 324 (e.g., a comb laser) configured to emit a multi-wavelength optical signal. The optical transmitter 322 includes a waveguide 326 having a first end coupled to the multi-wavelength optical source 324 (e.g., via an input coupler 328) and is configured to receive the multi-wavelength optical signal from the multi-wavelength optical source 324.

The optical transmitter 322 further includes an array of two or more optical modulators 350 (e.g., four) coupled to the waveguide 326, wherein a first optical modulator is configured to filter and modulate data onto the first wavelength of light (e.g., $\lambda_1$) from the waveguide and a second optical modulator is configured to filter and modulate data onto the second wavelength of light (e.g., $\lambda_2$) from the waveguide 326, and wherein the first and second modulated wavelengths of light are multiplexed together back into the waveguide 326 and transmitted to the optical receiver 330 via the optical fiber 332. A first end of the optical fiber 332 can be coupled to an output coupler 352 of the optical transmitter 302 coupled to a second end of the waveguide 326. A second end of the optical fiber 332 can be coupled to the optical receiver 330 (e.g., via an input coupler 338).

The light can then be transmitted off a chip or device the optical transmitter 302 is disposed on via the optical fiber 332 and sent across the optical fiber 332 to be demultiplexed and converted from the optical domain to the electrical domain by the optical receiver 330. The optical receiver 330 can includes the input coupler 338 to couple the optical fiber 332 to a waveguide 336.

The optical receiver 330 includes the waveguide 336 configured to receive the multi-wavelength optical signal from the optical transmitter with modulated data signals thereon. The optical receiver includes an array of two or more integrated optical filter and photodetectors 354 (e.g., four) coupled to the waveguide 336. The integrated optical filter and photodetectors 354 can include any of the features of integrated optical filter and photodetectors described herein (e.g., integrated optical filter and photodetectors 100). A first integrated optical filter and photodetector is configured to filter the first wavelength of light from the multi-wavelength optical signal propagating through the waveguide 336 and a second integrated optical filter and photodetector is configured to filter the second wavelength of light from the multi-wavelength optical signal propagating through the waveguide 336 different from the first wavelength of light. As described above, each of the first and second integrated optical filter and photodetectors includes a substrate, an insulator layer on the substrate, and a semiconductor layer on the insulator layer.

Each of the first and second integrated optical filter and photodetectors further includes an optical filter (e.g., optical filter 108) having a resonant cavity (e.g., cavity 110) formed in or on the semiconductor layer (e.g., a ring resonator 334 having a closed-loop waveguide). Each of the ring resonators 334 (identified individually as 334a-1, 334a-2, up to 334a-n, where n=2, 4, 8, 16, 32, etc.) are configured to be tuned to different resonant wavelengths respectively corresponding to different wavelengths of the emitted light from the optical transmitter 302.

Resonance properties of each ring resonator 334 can be precisely tuned to select the specific wavelength by varying the radius of each ring or by tuning the cladding index. Tuning can be accomplished via thermal tuning (e.g., providing a controllable micro-heater by each ring resonator), bias-tuning, or a combination of both. While referring specifically to ring resonators, in other examples, ring resonators as described herein can be replaced with microdisks or other suitable traveling wave resonators.

The ring resonators 334 act as filters to drop the respective resonant wavelengths from the waveguide 336. The array of ring resonators 334 receives the multi-wavelength optical signals from the optical transmitter 302. Resonant wavelengths specific or corresponding to each ring resonator 334 are individually demultiplexed into separate integrated Schottky photodetectors to convert the optical signals into electrical signals (e.g., for further processing) as described herein. Thus, each of the ring resonators 334 can "drop" or otherwise filter a single wavelength of modulated light or signals from the multiplexed optical signals having multi-wavelengths of light received across the optical fiber 332.

Each of the first and second integrated optical filter and photodetectors also includes two first metal fingers 312 and a second metal finger 314 interdigitated between the two first metal fingers on the semiconductor layer or closed-loop waveguide of each ring resonator forming Schottky barriers (e.g., forming a Schottky photodetector integrated on each ring resonator 334) wherein the first metal fingers are constructed from a different metal relative to the second metal finger. Each of the Schottky photodetectors is integrated with the respective ring resonator 334 to form the array of wavelength-selective photodetectors (e.g., integrated optical filter and photodetectors).

An example method of forming an integrated optical filter and photodetector as described herein can include one or more of the following steps. The method includes providing a substrate, an insulator layer on the substrate, and a semiconductor layer on the insulator layer. The method includes forming an optical filter having a resonant cavity in or on the semiconductor layer and depositing first metal fingers and a second metal finger interdigitated between the two first metal fingers on the semiconductor layer forming Schottky barriers. The first metal fingers are constructed from a different metal relative to the second metal finger.

In some implementations, the step of forming an optical filter in or on the semiconductor layer includes forming a ring resonator (e.g., forming a ring resonator with a closed-loop waveguide in the semiconductor layer). In some implementations, the step of depositing the first metal fingers and a second metal finger interdigitated between the two first metal fingers on the semiconductor layer includes depositing the first metal fingers and the second metal finger on the ring resonator (e.g., closed-loop waveguide of the ring resonator). In yet other implementations, as described herein, the semiconductor layer, insulator layer, and substrate have a Silicon-on-Insulator (SOI) structure.

As discussed above, such an improved integrated optical filter and photodetector and methods of fabrication thereof can simplify the assembly process and reduce assembly time and costs as the IPE of the Schottky barriers can overcome drawbacks of certain semiconductor materials that cannot absorb light of telecommunication wavelengths without additional Ge epitaxy steps. Additionally, because the photodetector portions simply include semiconductor material and metal fingers, no extra doping processes are necessary as with PIN photodiodes. Integrating the photodetector and optical filter on a single device as described herein can save space as well as simplify the WDM optical link of a Si photonic platform. The resonant nature of the microring or ring resonator and the mode confinement from the SPP effect can dramatically improve the light-matter interaction. The enhancement is helpful for achieving the responsivity necessary for photodetection of light of telecommunication wavelengths. Further, the MSM structure of the photodetector enables a high transit time-limited bandwidth and a high RC time-limit bandwidth due to the flexibility to adjust metal finger material, widths, and gap or spacing widths.

In the foregoing description, numerous details are set forth to provide an understanding of the subject disclosed herein. However, implementations may be practiced without some or all of these details. Other implementations may include additions, modifications, or variations from the details discussed above. It is intended that the appended claims cover such modifications and variations. The specification and drawings are, accordingly, to be regarded as illustrative rather than restrictive.

It will be recognized that the terms "comprising," "including," and "having," as used herein, are specifically intended to be read as open-ended terms of art. The term "or," in reference to a list of two or more items, covers all of the following interpretations of the word: any of the items in the list, all of the items in the list, and any combination of the items in the list. As used herein, the terms "connected," "coupled," or any variant thereof means any connection or coupling, either direct or indirect, between two or more elements; the coupling or connection between the elements can be physical (e.g., mechanical), logical, electrical, optical, or a combination thereof.

In the Figures, identical reference numbers identify identical, or at least generally similar, elements. To facilitate the discussion of any particular element, the most significant digit or digits of any reference number refers to the Figure in which that element is first introduced. For example, element 110 is first introduced and discussed with reference to FIG. 1.

The invention claimed is:

1. An integrated optical filter and photodetector comprising:
    a substrate;
    an insulator layer on the substrate;
    a semiconductor layer on the insulator layer;
    an optical filter comprising a ring resonator having a resonant cavity formed in or on the semiconductor layer;
    a photodetector comprising a portion of the ring resonator, one or more first metal fingers on the semiconductor layer, and a second metal finger on the semiconductor layer,
    wherein the one or more first metal fingers and the second metal finger are disposed over the portion of the ring resonator and form Schottky barriers, and
    wherein the one or more first metal fingers are constructed from a different metal relative to the second metal finger.

2. The integrated optical filter and photodetector of claim 1, wherein the one or more first metal finger is fingers are spaced from the second metal finger between about 100 nm to about 1000 nm.

3. The integrated optical filter and photodetector of claim 1, wherein the one or more first metal fingers comprise two first metal fingers, wherein the second metal finger is interdigitated between the first metal fingers and wherein the first metal fingers and second metal finger are formed on the ring resonator.

4. The integrated optical filter and photodetector of claim 3, wherein the first metal fingers and the second metal finger interdigitated between the two first metal fingers have a ground signal ground (GSG) pad configuration.

5. The integrated optical filter and photodetector of claim 1, wherein at least one of the one or more first metal fingers forms a Schottky barrier with the semiconductor layer having a hole barrier height between about 0.2 eV to about 0.4 eV and wherein the second metal finger forms a Schottky barrier with the semiconductor layer having an electron barrier height between about 0.2 eV to about 0.4 eV.

6. The integrated optical filter and photodetector of claim 1, wherein the one or more first metal fingers are constructed from one or more of: copper, aluminum, platinum, palladium, or gold.

7. The integrated optical filter and photodetector of claim 1, wherein the second metal finger is constructed from one or more of: copper, aluminum, platinum, palladium, or gold.

8. The integrated optical filter and photodetector of claim 1, wherein the semiconductor layer is undoped.

9. The integrated optical filter and photodetector of claim 1, wherein the semiconductor layer, insulator layer, and substrate have a Silicon-on-Insulator (SOI) structure.

10. The integrated optical filter and photodetector of claim 1, wherein the integrated optical filter does not include a germanium layer formed in or on the semiconductor layer.

11. The integrated optical filter and photodetector of claim 1, wherein the one or more first metal fingers have a thickness between about 10 nm to about 70 nm.

12. The integrated optical filter and photodetector of claim 1, wherein the one or more first metal fingers have a width between about 300 nm to about 500 nm.

13. A method of forming an integrated optical filter and photodetector, the method comprising:
    providing a substrate, an insulator layer on the substrate, and a semiconductor layer on the insulator layer;
    forming an optical filter comprising a ring resonator having a resonant cavity in or on the semiconductor layer;
    forming a photodetector integrated with the optical filter by depositing one or more first metal fingers and a second metal finger on the semiconductor layer, disposed over a portion of the ring resonator and forming Schottky barriers, wherein the one or more first metal fingers are constructed from a different metal relative to the second metal finger.

14. The method of claim 13, wherein the one or more first metal fingers comprises two first metal fingers and depositing the one or more first metal fingers and the second metal finger comprises depositing the second metal finger interdigitated between the two first metal fingers on the ring resonator.

15. An optical system comprising:
    an optical receiver comprising:
    a waveguide configured to receive a multi-wavelength optical signal;
    an array of two or more integrated optical filter and photodetectors coupled to the waveguide, wherein a first integrated optical filter and photodetector is configured to filter a first wavelength of light from the multi-wavelength optical signal propagating through the waveguide and a second integrated optical filter and photodetector is configured to filter a second wavelength of light from the multi-wavelength optical signal propagating through the waveguide different from the first wavelength of light, and wherein each of the first and second integrated optical filter and photodetectors comprises:
    a substrate;
    an insulator layer on the substrate;
    a semiconductor layer on the insulator layer;
    an optical filter comprising a ring resonator having a resonant cavity formed in or on the semiconductor layer;

a photodetector comprising a portion of the ring resonator and two first metal fingers and a second metal finger interdigitated between the two first metal fingers on the semiconductor layer forming Schottky barriers, wherein the first metal fingers and the second metal finger are disposed over the portion of the ring resonator and the first metal fingers are constructed from a different metal relative to the second metal finger.

16. The optical system of claim 15, further comprising:

an optical transmitter coupled to the optical receiver via an optical fiber, the optical transmitter comprising:

a multi-wavelength optical source configured to emit the multi-wavelength optical signal;

a waveguide coupled to the multi-wavelength optical source and configured to receive the multi-wavelength optical signal from the multi-wavelength optical source; and an array of two or more optical modulators coupled to the waveguide, wherein a first optical modulator is configured to filter and modulate data onto the first wavelength of light from the waveguide and a second optical modulator is configured to filter and modulate data onto the second wavelength of light from the waveguide, and wherein the first and second modulated wavelengths of light are multiplexed together back into the waveguide and transmitted to the optical receiver via the optical fiber.

17. The optical system of claim 16, wherein each of the optical modulators comprises a ring resonator.

18. The optical system of claim 15, wherein the optical receiver does not include any waveguides coupling the respective optical filters of the integrated optical filter and photodetectors to the respective photodetectors of the integrated optical filter and photodetectors.

* * * * *